(12) United States Patent
Abraham et al.

(10) Patent No.: US 8,105,850 B1
(45) Date of Patent: Jan. 31, 2012

(54) PROCESS FOR SELECTIVELY PATTERNING A MAGNETIC FILM STRUCTURE

(75) Inventors: David W. Abraham, Croton, NY (US); Assefa Solomon, Ossining, NY (US); Eugene J. O'Sullivan, Nyack, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/917,800

(22) Filed: Nov. 2, 2010

(51) Int. Cl.
*H01L 21/00* (2006.01)
*H01L 21/20* (2006.01)
*H01L 21/461* (2006.01)
*H01L 21/302* (2006.01)

(52) U.S. Cl. ........... 438/3; 438/384; 438/689; 438/754; 438/104; 257/E21.219; 257/E21.663; 257/E21.664; 257/E21.665

(58) Field of Classification Search ........... 257/E21.006, 257/E21.219, E21.663, E21.664, E21.665
See application file for complete search history.

(56) References Cited

U.S. PATENT DOCUMENTS

| | | | |
|---|---|---|---|
| 6,426,012 B1 | 7/2002 | O'Sullivan et al. | |
| 6,656,372 B2 | 12/2003 | Yates | |
| 7,252,774 B2* | 8/2007 | O'Sullivan et al. | 216/22 |
| 7,258,809 B2 | 8/2007 | O'Sullivan et al. | |
| 7,381,343 B2 | 6/2008 | Gaidis et al. | |
| 7,696,551 B2 | 4/2010 | Xiao et al. | |
| 2004/0229430 A1 | 11/2004 | Findeis et al. | |
| 2005/0254180 A1* | 11/2005 | Kanakasabapathy et al. | 360/324.2 |
| 2006/0014305 A1* | 1/2006 | Lee et al. | 438/3 |
| 2006/0289381 A1* | 12/2006 | O'Sullivan et al. | 216/22 |
| 2008/0156664 A1* | 7/2008 | O'Sullivan et al. | 205/793.5 |
| 2010/0078763 A1 | 4/2010 | Hosotani et al. | |
| 2010/0240151 A1* | 9/2010 | Belen et al. | 438/3 |

OTHER PUBLICATIONS

Gallagher, W.J., et al. "Development of the magnetic tunnel junction MRAM at IBM: From first junctions to a 16-Mb MRAM demonstrator chip", IBM J. Res. & Dev. vol. 50, No. 1, Jan. 2006, pp. 5-23A.
Ikeda, S., et al. "Tunnel magnetoresistance of 604% at 300 K by suppression of Ta diffusion in CoFeB/MgO/CoFeB pseudo-spin-valves annealed at high temperature", (c) 2008 American Institute of Physics, Applied Physics Letters 93, (2008) downloaded Oct. 30, 2009; pp. 082508-1-082508-3.

* cited by examiner

*Primary Examiner* — Mohsen Ahmadi
(74) *Attorney, Agent, or Firm* — Cantor Colburn LLP; Vazken Alexanian

(57) ABSTRACT

Processes for selectively patterning a magnetic film structure generally include selectively etching an exposed portion of a freelayer disposed on a tunnel barrier layer by a wet process, which includes exposing the freelayer to an etchant solution comprising at least one acid and an organophosphorus acid inhibitor or salt thereof, stopping on the tunnel barrier layer.

9 Claims, 2 Drawing Sheets

PROCESS FOR SELECTIVELY PATTERNING A MAGNETIC FILM STRUCTURE

BACKGROUND

The present invention relates to a wet etching method for MRAM magnetic tunnel junctions containing oxide based tunneling barriers.

MRAM is based on magnetic storage elements integrated with CMOS processing. Each storage element uses a magnetic tunnel junction (MTJ) device. The MTJ is generally composed of a fixed magnetic bottom layer (i.e., reference layer), a thin dielectric tunnel barrier layer, and a free magnetic top layer (i.e., freelayer), wherein the thin dielectric tunnel barrier layer is typically alumina (AlOx) or magnesium oxide (MgO). When a bias is applied to the MTJ, electrons that are spin polarized by the magnetic layers traverse the dielectric barrier through a process known as tunneling. The MTJ device has a low resistance when the magnetic moment of the freelayer is parallel to the fixed layer and a high resistance when the freelayer moment is oriented anti-parallel to the fixed layer moment. This change in resistance within the magnetic state of the device provides magnetoresistance.

Because of its small z direction thickness, e.g., typically about 10 to 100 angstroms, MTJ freelayers require gentle etching solutions, compared to typical microelectronic back end of the line (BEOL) films that are typically greater about 100 times the thickness of MRAM layers, to minimize lateral etching and to maximize etching selectivity with respect to the thin tunneling barrier layers, e.g., MgO or AlOx.

Etching solutions have previously been proposed for alumina-based tunnel barrier layers. One such solution is disclosed in U.S. Pat. No. 7,252,774 to O'Sullivan et al., which provides an etchant solution that, includes a surfactant inhibitor, e.g., an alkyl sulfonate inhibitor, and at least one weakly adsorbing acid, e.g., perfluoroalkane sulfonic acids. Because the IEP of bulk AlOx is about 9, the zero charge of the alumina-based tunnel barrier is significantly greater than the pH of the etchant solution. The negatively charged $SO_3^-$ groups of the sulfonate surfactant inhibitor adsorb onto the positively charged sites of the tunnel barrier surface, thereby protecting the tunnel barrier from dissolution or significantly slowing such dissolution by the acid.

MgO has an isoelectric point (IEP) of about 13, which is significantly higher than that for $AlO_x$ (IEP is about 9). As such, MgO has a much higher dissolution rate in acidic solutions relative to AlOx. Thus, the gain in stability for MgO tunneling barriers in the presence of the alkyl sulfonate inhibitors has been found to be much less than that observed for $AlO_x$ tunneling barriers, i.e., about 100 times less stable. Thus, the prior art solution for etching the freelayers disposed on alumina are not adequate at providing sufficient protection of magnesium oxide based tunneling barriers.

Accordingly, there is a need for etchant solutions for selectively removing the freelayer from MgO tunneling barriers.

SUMMARY

Exemplary embodiments include processes for selectively patterning a magnetic film. In one embodiment, the process comprises providing a magnetic structure comprising at least one bottom magnetic layer, at least one top magnetic layer, wherein the at least one bottom magnetic layer is separated from the at least one top magnetic layer by a MgO tunnel barrier layer, and said at least one top magnetic film layer having a protective layer located thereon; forming a patterned resist on said protective layer, wherein a portion of said protective layer is exposed; selectively etching said exposed portion of said protective layer by a reactive-ion etching process to expose portion of said at least one top magnetic film layer; and selectively etching said exposed portion of said at least one top magnetic film layer by a wet process which includes an etchant solution comprising at least one acid, and an organophosphorus acid inhibitor, or salt thereof, stopping on said tunnel barrier layer.

In another embodiment, the process comprises providing a magnetic structure comprising at least one bottom magnetic layer, at least one top magnetic layer, wherein the at least one bottom magnetic layer is separated from the at least one top magnetic layer by a MgO tunnel barrier layer, and said at least one top magnetic film layer having a protective layer located thereon; forming a patterned resist on said protective layer, wherein a portion of said protective layer is exposed; selectively etching said exposed portion of said protective layer by a reactive ion etching process to expose portion of said at least one top magnetic film layer; selectively etching said exposed portion of said at least one top magnetic film layer by a wet process which includes an etchant solution comprising an acid and an additive, wherein the acid comprises oxalic acid, sulfuric acid, glyoxylic acid, perfluoroalkane sulfonic acid, and mixtures thereof, and the additive comprises at least on of an organophosphorus acid, stopping on the tunnel barrier layer.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

The present invention relates to wet etching method for magnetoresistive random access memory (MRAM). The wet etch method generally includes exposing the top magnetic layer, also referred to as the magnetic freelayer, disposed on the magnesium oxide tunneling barrier layer to an etchant solution including an acid and an organophosphorus acid inhibitor. As will be described in greater detail herein, the organophosphorus acid inhibitor is believed to react and protect the tunneling barrier layer.

Figure 1:
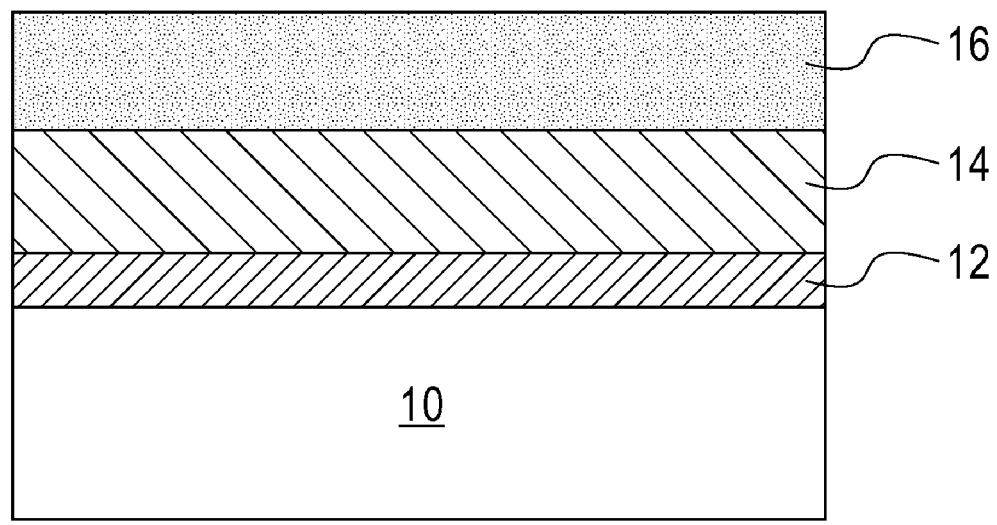
FIGS. 1-4 are pictorial views through cross-sections illustrating the basic processing steps of the present invention that are used in patterning a magnetic thin film structure.

Reference is first made to FIG. 1 which includes a portion of a magnetic thin film structure that can be utilized in the present invention. Specifically, the portion of the magnetic structure shown in FIG. 1 includes at least one bottom magnetic thin film layer 10 and at least one top magnetic film layer 14 (also referred to as the magnetic freelayer), which are separated by a tunnel barrier layer 12. The upper most surface layer of the at least one top magnetic layer 14 can have—a passivating layer 16 located thereon and in some embodiments, the passivating layer may include a surface oxide (not shown). The portion of the magnetic thin film structure shown in FIG. 1 may further include a semiconductor substrate, a SiOx layer and a Ti layer, or other adhesion layers which would be located beneath the at least one bottom magnetic thin film layer 10. For clarity, however, the material layers located beneath the layer 10 are not shown in FIGS. 1-3.

The portion of the magnetic thin film structure illustrated in FIG. 1 is formed utilizing conventional techniques well known in the art that are capable of forming such a structure. For example, the various magnetic and non-magnetic layers may be formed by utilizing the same or different deposition process including, for example, chemical vapor deposition (CVD), plasma-assisted CVD, plating, evaporation, sputtering, chemical solution deposition and other like deposition processes.

The top and bottom magnetic film layers (14 and 10, respectively) of the illustrated structure may be composed of the same or different magnetic layers in which each individual layer has a thickness of less than 150 angstroms (Å). Preferably, each individual magnetic film layer (10 or 14) has a thickness of less than 100 Å.

Illustrative examples of magnetic films that can be employed in the present invention include, but are not limited to: $Ni_xFe_y$, $Ni_xCO_yFe_z$, and other like magnetic films. In the above formulas, x, y, and z are any integers whose sum adds up to 100. In accordance with the present invention, the bottom magnetic film layer 10 as well as the top magnetic film layer 14 may comprise only one magnetic film or they may comprise a stack of magnetic films.

In one embodiment of the present invention, the top magnetic film layer 14 is comprised of a Permalloy layer, i.e., a $Ni_xFe_y$ type, or $CO_xFe_y$ layer, while the bottom magnetic film layer 10 comprises a stack consisting of $Ni_xFe_y$ and $CO_xFe_y$.

In one embodiment of the present invention, any exposed edge of the magnetic structure may be coated with a conventional passivating material so as to prevent certain underlying films, notably the noble metal containing exchange bias layer, from engaging in Galvanic type reactions that could inhibit the etching process.

The tunnel barrier layer 12 employed in the present invention is magnesium oxide (MgO), which is capable of sustaining a tunneling current and which does not chemically degrade the properties of the top and bottom magnetic layers (14 and 10, respectively). In some instances, the tunnel barrier layer 12 may also serve as a diffusion barrier. The tunnel barrier layer 12 employed in the present invention is a thin layer which has a thickness less than about 15 Å.

The passivating layer 16 employed in the present invention includes any metal layer such as, for example, Ti, TiN, Ta, or TaN which serves as a barrier layer preventing diffusion of moisture, air and other contaminants from contacting with the underlying magnetic layers and the tunnel barrier layer. The thickness of this layer may vary, but typically the passivating layer 16 has a thickness of from about 20 to about 1000 Å.

As indicated above, the passivating layer 16 may include a surface oxide (not shown), which is located on the upper surface of the passivating layer 16 when the structure is exposed to air.

Figure 2:
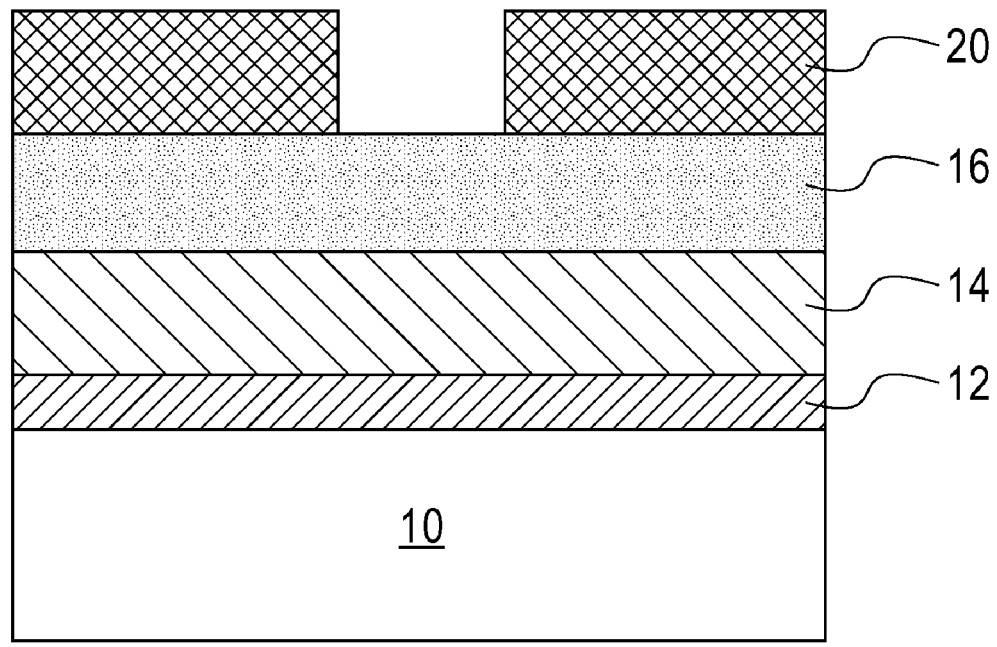
Figure 3:
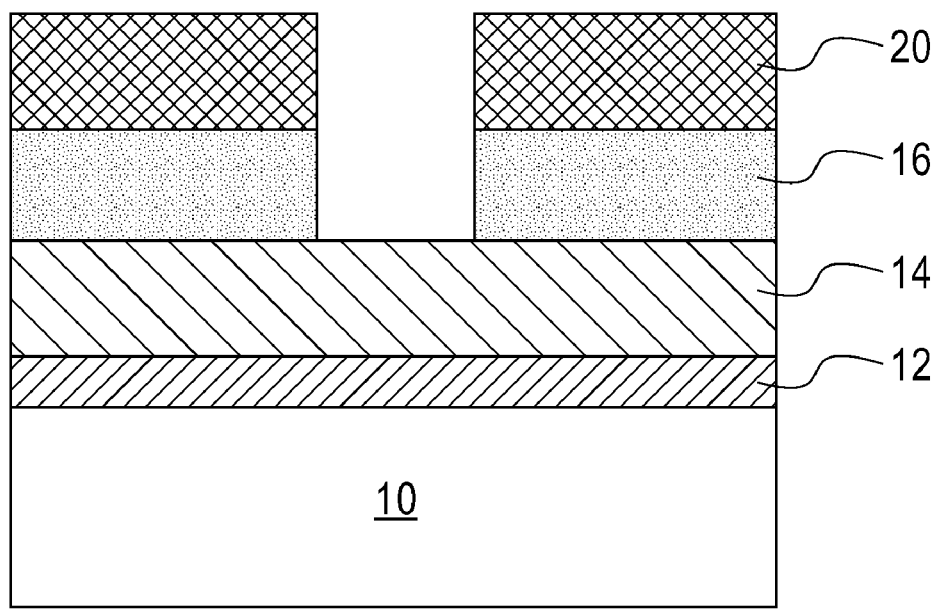

Next, and as illustrated in FIG. 2, patterned resist 20 is formed on the surface of the passivating layer 16 utilizing conventional lithography. Specifically, the lithography process includes: (i) applying a conventional photoresist to the passivating layer 16 via a conventional deposition process such as spin-on coating, dip coating, CVD, plasma-assisted CVD, evaporation and chemical solution deposition; (ii) exposing the photoresist to radiation to form a desired pattern therein; and (iii) developing the desired pattern using a conventional developer solution to expose a portion of the upper surface of the passivating layer 16.

Following the formation of the patterned resist, the inventive etching process, which will be described in more detail below, is performed. First, an optional oxygen ashing process may be performed. The optional oxygen ashing process includes the use of oxygen ashing conditions well known to those skilled in the art that are capable of removing any etched resist residue from the exposed surface of the passivating layer 16.

Next, the exposed portion of the passivating layer 16 is subjected to a suitable etching process that includes the use of RIE. Any suitable etching process may be used, such as the etching process disclosed in U.S. Pat. No. 6,426,012. Those skilled in the art can ascertain the suitable conditions without undue experiments. In this step of the present invention, the passivating layer 16 is selectively patterned to expose a portion of the at least one top magnetic film layer 14, see FIG. 3.

Alternatively, and when a Ta (or TaN) passivating layer 16 is employed, the above wet etching step may be replaced with a $SF_6$ RIE plasma etching process. The use of $SF_6$ RIE plasma etching to remove the Ta (or TaN) passivating layer 16 also modifies the surface of the exposed magnetic layer 14 to include sulfur. Alternatively, another RIE etchant gas which removes Ta (or TaN) could be used first and thereafter the etched surface is treated with a $SF_6$ gas.

The presence of sulfur on the magnetic thin film layer 14 is advantageous since sulfur-containing magnetic film layers 14 etch at a much faster rate than magnetic film layers that do not include sulfur fragments.

Figure 4:
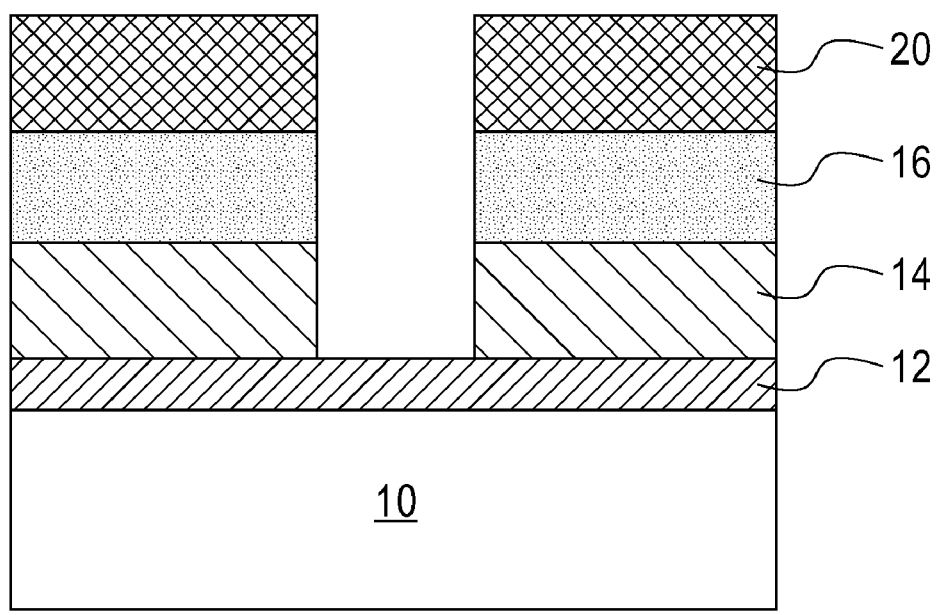

FIG. 4 shows the next step of the present invention in which exposed top magnetic layer 14 is selectively etched utilizing an etching process that is capable of stopping on the MgO tunnel barrier layer 12. In this step of the present invention, the exposed top magnetic film layer 14 is selectively etched utilizing an etchant solution that includes at least one acid and an organophosphorus acid inhibitor or salt thereof. The organophosphorus acid inhibitor strongly inhibits MgO etching.

The organophosphorus acid inhibitors react with the surface layer of the hydroxyl groups on the MgO surface, whereas sulfonates merely undergo an electrostatic-type interaction and are thus less protective. Suitable organophosphorus acid inhibitors include organophosphorus compounds having an organic substituent, which may or may not have a direct phosphorus-carbon bond. In one embodiment, the organophosphorus acid inhibitors are alkyl phosphonic acids of the formula $CH_3(CH_2)_nPO(OH)_2$, wherein n=5 to 11. In other embodiments, the organophosphorus acid inhibitors are alkyl phosphoric acids of the formula $CH_3(CH_2)_nOPO(OH)_2$, wherein n=5 to 11. The organophosphorus acid inhibitors may include the corresponding salts of the alkylphosphonic and alkyl phosphoric acids.

Using a phosphonate molecule as an exemplary organophosphorus acid inhibitor, wherein n=5, a typical reaction with the MgO layer can be represented as follows:

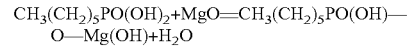

$$CH_3(CH_2)_5PO(OH)_2 + MgO = CH_3(CH_2)_5PO(OH)-O-Mg(OH) + H_2O$$

As shown, a chemical bond is formed between the phosphonate inhibitor and the magnesium ion bound in the surface of the MgO tunneling barrier layer accompanied by release of a water molecule. Relative to prior art alumina barrier layers, the interaction between the phosphonate inhibitor and the MgO surface is much stronger because of the chemical bond that is formed than the electrostatic interaction between a negatively charged anionic sulfonate group and the positively charged alumina ions in the case of alumina tunneling barriers.

Suitable acids that can be employed in the etchant solution for selectively removing the magnetic freelayer (e.g., top magnetic layer 14) after hardmask etch patterning include, without limitation, aqueous solutions of perfluorosulfonic acids, sulfuric acids, and organic acids such as oxalic acids, glyoxylic acids, mixtures thereof, and the like. The concentration of acid in the etchant solution is generally about $10^{-3}$ molar to about 1.0 molar. The concentration for the organophosphorus acid inhibitor is generally about $2 \times 10^{-3}$ to about $5 \times 10^{-2}$ molar.

Freelayer etching may be carried out by immersing the wafers in the etchant solution, by spraying the etchant solution onto the wafer surface, and the like. In the case of etching by spraying, the complete solution containing both the acid and the organophosphorus acid inhibitor may be used for the duration of the freelayer etching. Alternatively, the freelayer may be partially etched with acid and then with the organophosphorus inhibitor containing solution added to the sprayed acid solution to complete the freelayer etch so as to ensure stopping at the tunnel barrier layer. Adding the organophosphorus inhibitor after partially etching the freelayer may be used when there is significant oxidation of the freelayer surface and a possibility of the organophosphorus inhibitor reacting with the oxide on the freelayer, which may result in slowing the freelayer etching rate.

This etching step is typically carried out at a temperature of about 15° C. to about 50° C. for a period of time from about 0.5 to about 15 minutes, depending on the source and type of parts, the condition of the free top layer surface, and the thickness of the top magnetic layer 14. More preferably, the etching step is carried out at a temperature of about 20° C. to about 35° C. Due to the limited solubility of long-chain alkylsulfonic acid salts in aqueous solution, it is preferred to employ good agitation in this etching step to ensure efficient transport of the surfactant inhibitor to the surface.

Following the etching step of the freelayer 14, the patterned structure may be rinsed with a suitable inert solvent or supercritical fluid and the patterned resist may then be stripped utilizing any well known stripping process. The patterned magnetic structure may then be subjected to conventional MRAM processing techniques also well known to those skilled in the art.

It should be noted that the structures as illustrated in the Figures of the present invention are not drawn to scale. Namely, the various structures are illustrated as exemplary examples. As such, the length, height and width of various structures as shown in the Figures should not be interpreted as a limitation in the present invention.

All ranges disclosed herein are inclusive of the endpoints, and the endpoints are combinable with each other.

All cited patents, patent applications, and other references are incorporated herein by reference in their entirety.

The use of the terms "a" and "an" and "the" and similar referents in the context of describing the invention (especially in the context of the following claims) are to be construed to cover both the singular and the plural, unless otherwise indicated herein or clearly contradicted by context. Further, it should further be noted that the terms "first," "second," and the like herein do not denote any order, quantity, or importance, but rather are used to distinguish one element from another.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A process for selectively patterning a magnetic film structure, comprising:
providing a magnetic structure comprising at least one bottom magnetic layer, at least one top magnetic layer, wherein the at least one bottom magnetic layer is separated from the at least one top magnetic layer by a tunnel barrier layer, wherein the at least one top magnetic layer and the at least one bottom magnetic layer are the same or are different and are selected from the group consisting of $Ni_xCO_yFe_z$ and $CO_xFe_yB_z$, wherein x, y, and z are integers whose sum adds up to 100, and said at least one top magnetic film layer having a protective layer located thereon;
forming a patterned resist on said protective layer, wherein a portion of said protective layer is exposed;
selectively etching said exposed portion of said protective layer by a reactive-ion etching process to expose portion of said at least one top magnetic film layer;
and selectively etching said exposed portion of said at least one top magnetic film layer by a wet process which includes an etchant solution comprising at least one acid, and an organophosphorus acid inhibitor or salt thereof, stopping on said tunnel barrier layer, wherein the organophosphorus acid inhibitor or salt thereof is an alkylphosphoric acid of the formula: $CH_3(CH_2)_nOPO(OH)_2$, wherein n is 5 to 11.

2. The process of claim 1, wherein the tunnel barrier layer is magnesium oxide.

3. The process of claim 1, wherein the at least one top magnetic layer and the at least one magnetic bottom layer is $CO_xFe_yB_z$.

4. The process of claim 1, wherein each one of the at least one top and bottom magnetic layers has a thickness of less than 150 angstroms.

5. The process of claim 1, wherein the alkylphosphoric acid is octylphosphoric acid or a salt thereof.

6. The process of claim 1, wherein the tunnel barrier is an aluminum oxide of the formula $Al_2O_3$.

7. The process of claim 1, wherein the at least one acid is at a concentration of $10^{-3}$ molar to 1.0 molar.

8. A process for selectively patterning a magnetic film structure, comprising:
providing a magnetic structure comprising at least one bottom magnetic layer, at least one top magnetic layer, wherein the at least one bottom magnetic layer is separated from the at least one top magnetic layer by a tunnel barrier layer, wherein the at least one top magnetic film layer and the at least one bottom magnetic layer are the same or different, and are $Ni_xCO_yFe_z$ or $CO_xFe_yB_z$, wherein x, y, and z are integers whose sum adds up to 100 and said at least one top magnetic film layer having a protective layer located thereon;
forming a patterned resist on said protective layer, wherein a portion of said protective layer is exposed;
selectively etching said exposed portion of said protective layer by a reactive ion etching process to expose portion of said at least one top magnetic film layer; and
selectively etching said exposed portion of said at least one top magnetic film layer by a wet process which includes an etchant solution comprising an acid and an additive, wherein the acid comprises oxalic acid, sulfuric acid, glyoxylic acid, perfluoroalkane sulfonic acid, and mixtures thereof, and the additive comprises at least one of an organophosphorus acid, stopping on the tunnel barrier layer, wherein the organophosphorus acid is an alkylphosphoric acid of the formula: $CH_3(CH_2)_nOPO(OH)_2$, wherein n 5 to 11 or salt thereof.

9. The process of claim 8, wherein the tunnel barrier layer is magnesium oxide.

* * * * *